United States Patent [19]

Fitch et al.

[11] 4,129,919
[45] Dec. 19, 1978

[54] PRINTED CIRCUIT BOARD SCRUBBER AND DRYER

[75] Inventors: Lawrence R. Fitch, 9224 Kirkwood, Cucamonga, Calif. 91730; Jerry L. Swenson, Upland, Calif.

[73] Assignee: Lawrence R. Fitch, Cucamonga, Calif.

[21] Appl. No.: 881,633

[22] Filed: Feb. 27, 1978

[51] Int. Cl.² .................. A46B 13/04; F26B 13/26
[52] U.S. Cl. .......................... 15/302; 15/308; 15/77; 15/102; 34/71; 34/95; 51/80 A
[58] Field of Search ............... 15/77, 102, 302, 308; 51/22, 23, 80 A

[56] References Cited

U.S. PATENT DOCUMENTS

| 1,930,575 | 10/1933 | Wynd et al. | 15/77 X |
|---|---|---|---|
| 2,321,179 | 6/1943 | Boyer | 15/77 |
| 2,824,321 | 2/1958 | Bandy | 15/77 |
| 3,245,102 | 4/1966 | Gallmeyer et al. | 15/77 |
| 3,449,781 | 6/1969 | French et al. | 15/77 |
| 3,562,834 | 2/1971 | Stievenart et al. | 15/77 X |
| 3,636,662 | 1/1972 | Maca | 15/77 |

Primary Examiner—Edward L. Roberts
Attorney, Agent, or Firm—Poms, Smith, Lande & Glenny

[57] ABSTRACT

Scrubbing and drying apparatus particularly suited for use in scrubbing and drying printed circuit boards is disclosed. The apparatus is characterized by single knob precision adjustment of the scrubbing rollers incorporated therein and quiet operation at noise levels well within employee noise safety limits by the elimination of high pressure air nozzles typically employed in such scrubbing and drying apparatus according to the prior art. A novel anti-sway mounting is employed in conjunction with the scrubbing rollers to affect the single knob adjustment capability. A chamois covered roller is used to blot the surface of the board of substantially all its water content prior to final drying by low pressure airstreams.

13 Claims, 9 Drawing Figures

PRINTED CIRCUIT BOARD SCRUBBER AND DRYER

BACKGROUND OF THE INVENTION

The present invention relates to scrubbing and drying apparatus employed to clean the surface of sheet materials and more particularly to scrubbing and drying apparatus used for conditioning the surface of printed circuit boards.

Printed circuit boards are used in a multitude of electronic applications. Each printed circuit board comprises a substrate of thin flat insulating material having a conductive surface applied to one or both sides. Portions of the conductive material are removed through chemical etching processes to leave the desired pattern of interconnections on the surface of the board. Electronic components are interconnected between the conductive patterns remaining on the board such as by soldering thereto to provide the finished electronic circuit. To assure proper electrical connection of the leads of the electronic components soldered to the conductive portions of the surface and to eliminate possible conductive paths across the insulating surface of the substrate between adjacent conductive portions from deposits remaining from the etching process, the surface of the boards must be thoroughly washed, scrubbed, and dried.

Apparatus for automatically accomplishing the scrubbing and drying procedure is not new in the art. Typically, a plurality of coated rollers driven in unison are disposed transverse of a box-like enclosure in opposed parallel-spaced relationship to form a pathway through which the printed circuit boards are moved. The boards are inserted between the first pair of opposed rollers at one end and move lengthwise through the enclosure between the driven rollers to the opposite end from which they emerge. Intermediate the inlet and outlet from the scrubber/dryer enclosure, the boards are scrubbed on one or both sides by a rotating roller or brush in combination with water and then dried.

Such scrubber/dryer apparatus according to the prior art contains two major shortcomings. First, the method of positionally adjusting the scrubbing rollers is generally inaccurate in relation to the degree of accuracy required when working with such precision parts. Specifically, it is desirable to maintain the roller in a completely parallel relationship to the surface of the printed circuit board passing therethrough while retaining the capability for positionally adjusting the roller with relationship to the surface itself. The amount of pressure applied by the roller scrubbing the surface of the printed circuit board is critical and should be kept equal across the entire surface. If too little pressure is applied, the scrubbing operation is incomplete. If too much pressure is applied, the conductive surface on the printed circuit board can be damaged as by "sanding" through and/or the lifting thereof from the surface by lifting forces created in combination with heat generated by high friction.

A typical prior art technique for adjusting the position of a scrubbing roller within such apparatus is shown in FIG. 1. The view of FIG. 1 is a simplified view looking longitudinally into a portion of a scrubber/dryer unit. That is, the printed circuit board generally indicated as 10 is moving into or out of the paper as viewed. The aforementioned enclosure comprises a pair of parallel spaced sidewalls 12 having a top 14 therebetween. A pair of independently movable side members 16 are carried by the sidewalls 12 in a manner to be movable vertically as indicated by the arrows 18. The scrubber roller 20 (typically of a material sold by the 3M Company under the name Scotch-Brite) is journaled between the side members 16 for rotation by a rotating means (not shown). A so-called "Billy roller" 22 is rotatably journaled to the sidewalls 12 in parallel, opposed, spaced relationship to the scrubber roller 20. The printed circuit board 10 is supported by the Billy roller 22 as it passes beneath the scrubber roller 20. To provide for various thicknesses of printed circuit board 10 and to vary the pressure being applied to the surface of the circuit board 10 by scrubber roller 20 as it rotates in its scrubbing operation, movable side members 16 are moved vertically up or down. To maintain the constant pressure across the width of the printed circuit board 10 as previously discussed, scrubber roller 20 should be maintained in a completely parallel relationship to the Billy roller 22. To effect this simultaneous movement of movable side members 16, a pair of shafts 24 are rotatably carried by top 14 on one end and threadedly engaged into corresponding threaded holes in movable side members 16 on the opposite end. As shown, each shaft 24 extends through top 14 and has a toothed gear 26 attached thereto. One shaft 24 additionally has a knurled knob 28 on the end thereof for the gripping thereof and turning of the one shaft 24 thereby by an operator. The two toothed gears 26 are interconnected by a chain 30 such as a bicycle chain. Thus, by turning knurled knob 28, the associated shaft 24 and toothed gear 26 thereon is rotated. The chain 30 is moved in combination with the one toothed gear 26 to, in turn, rotate the second toothed gear 26 engaged therewith and, correspondingly, its shaft 24. All things being perfect, this prior art technique would probably accomplish its desired end. Unfortunately, the chances of having the threads exactly equally positionally spaced and the positioning of the links of chain 30 meshing with the teeth of toothed gears 26 at precisely the exact positional relationship are remote. Likewise, such apparatus is subject to lack of precision and cummulative tolerance motions throughout whereby the desired parallel movement objectives are not, in actuality, met.

The second major drawback is the high noise associated with the drying operation in most prior art scrubber/dryers. In order to remove the water from the surface of the printed circuit board prior to its exit from the enclosure, prior art scrubber/dryers typically employ an air knife. An air knife comprises a plenum chamber having a thin slit therein extending longitudinally traverse the path of the printed circuit board. High pressure air is forced into the plenum and out the slit forming a high energy sheet of "knife" of air which is directed in the direction opposite the movement of the printed circuit board to peel the film of water from the surface thereof in the manner of a knife. Both the motor/fan combination employed to generate the high pressure air and the high pressure air itself emanating from the slit are sources of high pitch and high volume sounds well beyond the typical employee and safety and welfare standards being imposed by various agencies such as OSHA.

Wherefore, it is the object of the present invention to provide an improved printed circuit board scrubber/dryer providing for true precision adjustment of the roller spacing while maintaining its parallel relationship to the corresponding Billy roller to form a true parallel path for the movement of the printed circuit board therethrough and incorporating an efficient drying apparatus not requiring the high pressure air knife arrangement of the prior art.

SUMMARY

The aforementioned objectives have been met in scrubbing and drying apparatus having an enclosure containing a plurality of equally spaced driven rollers mounted thereto defining a pathway for moving a flat article therethrough and having a source of water directed on a surface of the article, a scrubbing roller mounted between a pair of movable members for scrubbing the surface of the article, a partial-drying assembly for removing a portion of the water on the article following the scrubbing thereof, and a source of drying air for drying the remaining water from the partially dried article, the improvement of the present invention comprising anti-sway means connected to the movable members for holding the movable members in positional synchronization as said members are moved whereby the scrubbing roller is always maintained parallel to the surface of the article being scrubbed thereby; and, adjusting means interconnected between the enclosure and the anti-sway means for positionally adjusting the anti-sway means whereby the parallel distance from the roller to the pathway through which the articles are moved is adjusted. In the preferred embodiment disclosed, the partial-drying assembly comprises a first roller having a rigid center shaft rotatably journaled for rotation, a cylindrical layer of supporting material concentrically disposed about the center shaft, and a porous compressible material disposed concentrically about the layer of supporting material; and, a second roller disposed in parallel spaced relationship to the first roller on the opposite side of the pathway in the enclosure to force the article against the first roller as the article is moved therebetween an amount sufficient to compress the porous compressible material between the article and the layer of supporting material whereby the water is blotted from the article by the compressing and decompressing of the porous compressible material.

DESCRIPTION OF THE PREFERRED EMBODIMENT

Figure 1:
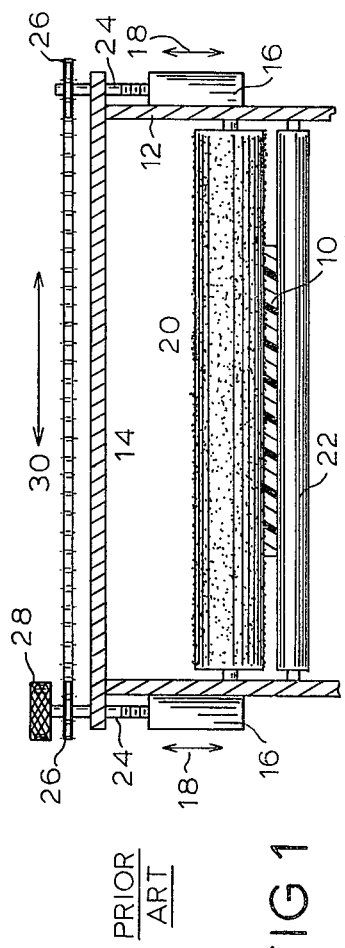
FIG. 1 is a partially cut-away end elevation of prior art adjusting apparatus used for positionally adjusting a scrubbing roller within a scrubber/dryer.
Figure 2:
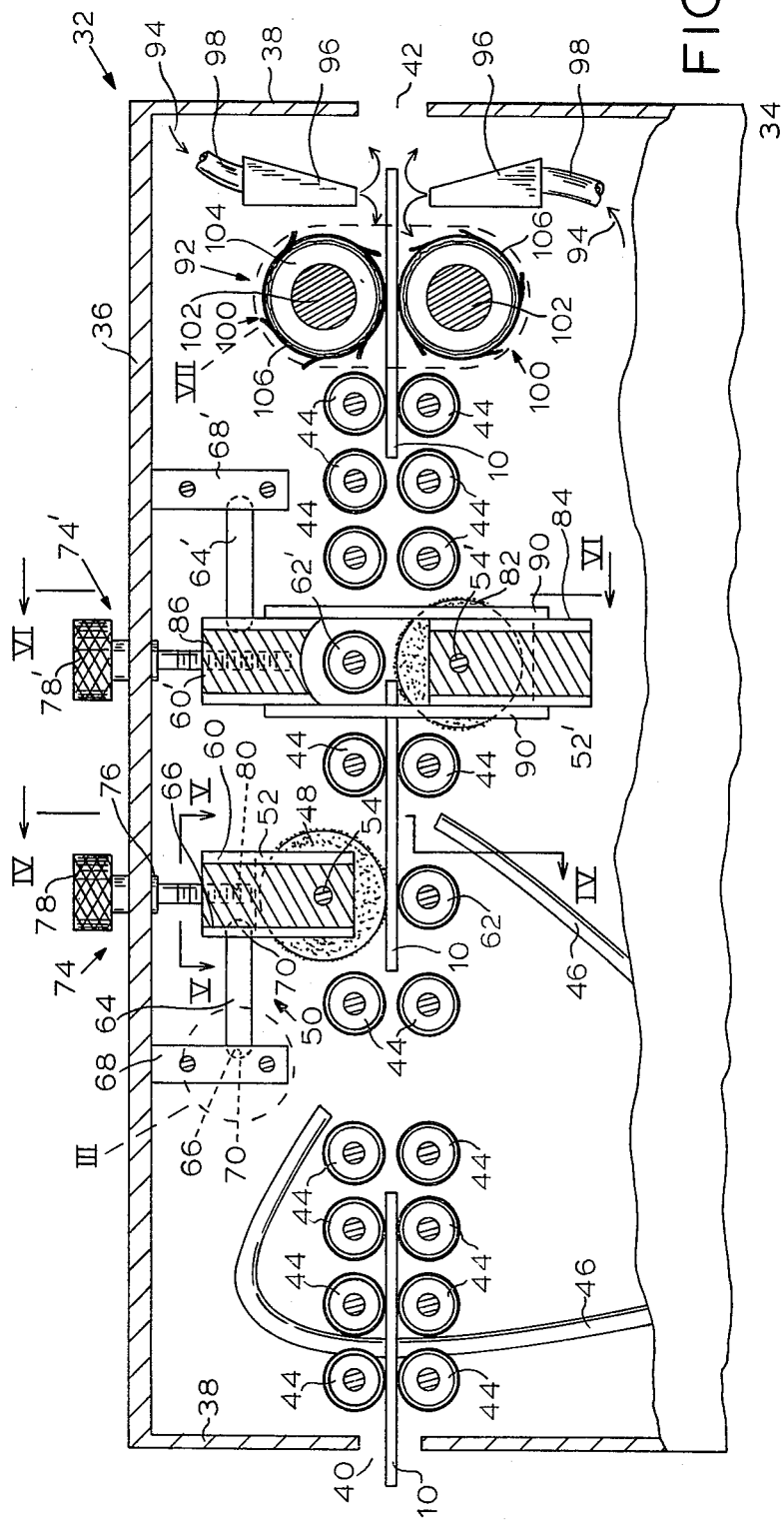
FIG. 2 is a partially cut-away side elevation of a scrubber/dryer incorporating the improvements of the present invention.
Figure 3:
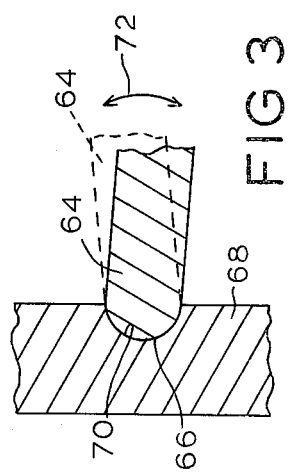
FIG. 3 is a detailed cut-away side elevation through the preferred mounting technique for the anti-sway bar employed within the preferred embodiment of roller adjusting apparatus according to the present invention.

Referring first to FIG. 2, a scrubber/dryer generally indicated as 32 is shown in simplified partially cut-away form so as to make the specific details of the present invention more readily apparent. Scrubber/dryer 32 is contained in, and in many cases the components thereof are mounted to, an enclosure having a pair of rigid parallel spaced sidewalls 34, a rigid top 36 disposed between the sidewalls 34, and a pair of vertical end walls 38 disposed at opposite ends between the sidewalls 34 and the top 36. A horizontal entry slit 40 is provided in one end wall 38 for the insertion of printed circuit boards 10 and a horizontal exit slit 42 is provided in the opposite end wall 38 for the exit of printed circuit boards 10 from the scrubber/dryer 32. As thus configured and viewed in FIG. 2, therefore, the printed circuit boards 10 are moving from the left to the right.

A plurality of equally spaced driving rollers 44 are rotatably journaled between the sidewalls 34 to provide a pathway through which the printed circuit boards 10 move between the entry slit 40 and exit slit 42. Driving rollers 44 are rigid steel roller bars having a thin coating of plastic material on the surface thereof to provide a cushioned gripping surface for moving the printed circuit boards 10 through the scrubber/dryer 32 without injury to the surface thereof. Driving rollers 44 are rotated in combination by appropriate means (not shown) well known in the art which form no part of the present invention. For scrubbing and drying both sides of the printed circuit boards 10 as envisioned by the preferred embodiment of the present invention, a pair of hoses 46 are connected to a source of wash water and positioned to direct the water on the upper and lower surfaces respectively of the printed circuit boards 10 passing through scrubber/dryer 32. The majority of the water returns by gravity to a drain in the base of the scrubber/dryer 32 to be disposed of.

Figure 5:
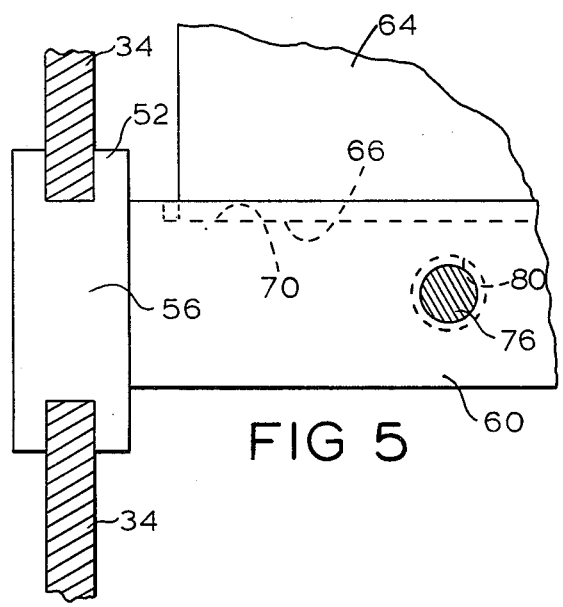
FIG. 5 is a cut-away plan view of the apparatus of FIG. 2 as viewed in the plane V—V.
Figure 4:
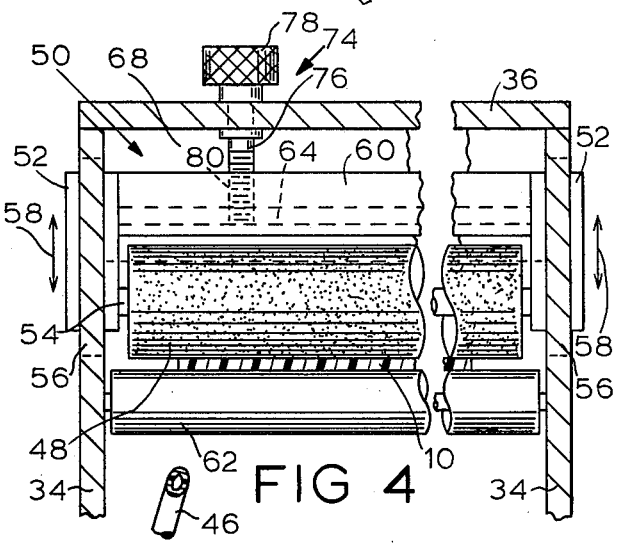
FIG. 4 is a partially cut-away end elevation of the upper roller adjusting apparatus as employed in the apparatus of FIG. 2 viewed in the plane IV—IV.
Figure 7:
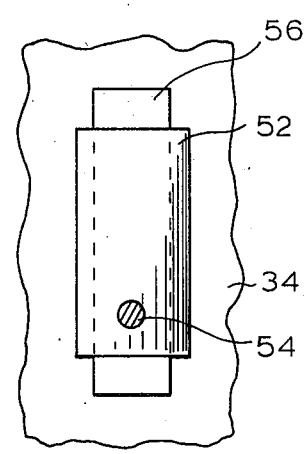
FIG. 7 is a side elevation of the movable members employed in the present invention to which the scrubber roller is journaled.

An upper scrubbing roller 48 (of the preferred 3M Company Scotch-Brite material) is shown mounted according to the preferred embodiment of the present invention employing anti-sway apparatus generally indicated as 50. The mounting of upper scrubbing roller 48 with anti-sway apparatus 50 can best be understood with simultaneous reference to FIGS. 2, 3, 4, 5 and 7. Upper scrubbing roller 48 is rotatably journaled between a pair of movable members 52 on a driven shaft 54. Driven shaft 54 can be driven by any of a number of techniques well known in the art which form no part of the present invention. Movable members 52 are generally H-shaped and disposed within a slot 56 having parallel sidewalls (see FIGS. 5 and 7). Thus shaped and mounted, movable members 52 are disposed to move vertically up and down in the direction of arrows 58 only. To effect the objectives of the present invention, the two movable members 52 are interconnected by a first rigid member 60. As can be best seen in FIG. 4, upper scrubbing roller 48 is journaled adjacent the bottom of each movable member 52 and first rigid member 60 is disposed between the upper portions of movable members 52 in spaced relationship to roller 48. First rigid member 60 is connected to movable members 52 to hold members 52 in positional synchronization with driven shaft 54 parallel to a Billy roller 62 rotatably journaled horizontally between sidewalls 34 having the upper surface thereof in a common plane with the driving rollers 44. With nothing more, movable members 52 and upper scrubbing roller 48 could be moved vertically up and down in combination in approximately a parallel relationship to Billy roller 62. Because of the necessary clearance between movable members 52 and sidewalls 34 as well as the interior of slot 56 to allow free movement thereof, however, only an approximate parallel relationship could be maintained without something more.

The something more which provides the precise positional adjustment capability of the present invention is the incorporation of an anti-sway bar 64 operably connected to the first rigid member 60 to prevent any motion thereof except in the desired adjustment direction. Anti-sway bar 64 is, in effect, a second rigid member being, in the preferred embodiment shown, a piece of rigid parallel bar stock having parallel and semi-circular edges 66. A third rigid member 68 (also of a rectangular cross-section bar stock) is rigidly mounted between the sidewalls 34 in parallel spaced relationship to first rigid member 60. First rigid member 60 and third rigid member 68 have respective semi-circular grooves 70 machined therein to be parallel to the Billy roller 62 and substantially in a common horizontal plane. Third rigid member 68 is positioned from first rigid member 60 a distance such that the anti-sway bar (second rigid member) 64 can be positioned therebetween with the parallel semi-circular edges 66 thereof lodged within the semi-circular grooves 70 of members 60 and 68. As can be seen from FIG. 3, the positioning of the semi-circular edge 66 in the semi-circular grooves 70 acts as a hinge allowing the anti-sway bar 64 limited rotational movement as indicated by the arrow 72. Since the typical vertical adjustment of the roller 48 to accommodate different thicknesses of printed circuit board 10 is measured in fractions of an inch, a limited rotational movement of anti-sway bar 64 within grooves 70 of members 60 and 68 is sufficient to allow movable members 52 to move sufficiently while maintaining first rigid member 60 and movable members 52 connected thereto rigidly held against any other motion but that vertical movement permitted by the limited rotational movement thus described.

An adjusting member generally indicated as 74 is provided for positioning and holding first rigid member 60 and, thereby, upper scrubbing roller 48. Adjusting member 74 comprises a shaft 76 passing through and rotatably journaled in top 36. A knurled knob 78 is operably connected on the outside of top 36 for rotational movement by an operator. The opposite end of shaft 76 is threaded and engaged into a corresponding threaded hole 80 in first rigid member 60. Thus it can be seen, if a standard "right-handed thread" is employed on shaft 76, clockwise rotation of knob 78 will draw first rigid member 60 towards top 36 thereby raising the scrubbing roller 48 in continued parallel relationship to Billy roller 62 while counter-clockwise rotation of knob 78 will force first rigid member 60 away from top 36 moving scrubbing roller 48 closer to Billy roller 62 in continued parallel relationship therewith.

Figure 6:
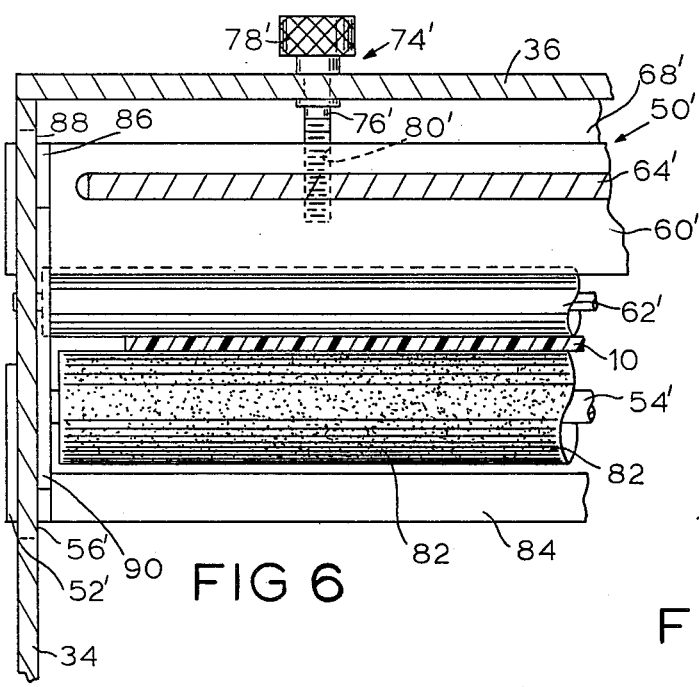
FIG. 6 is a cut-away end elevation of the lower roller adjusting apparatus of the present invention as shown in FIG. 2 as seen from the plane VI—VI.

Referring now to FIG. 6 in conjunction with FIG. 2, the preferred method of mounting the lower scrubbing roller 82 in a substantially identical manner disclosed. To effect the scrubbing of the lower surface of the printed circuit board 10, of course, lower scrubbing roller 82 must be positioned below the path of movement of the printed circuit boards 10 through scrubber/dryer 32 and the corresponding Billy roller 62' must be positioned above the boards 10. To maintain the corresponding lower roller adjusting member 74' adjacent the adjusting member 74 of the upper roller on the top scrubber/dryer 32 for ease of operation, a modification of the previously described apparatus is required. This is because of the necessity for placing the Billy roller 62' at a location where, otherwise, a slot would exist. Accordingly, the lower scrubbing roller 82 is rotatably journaled between a pair of movable members 52' vertically movable disposable in slots 56' adjacent the desired position of roller 82. Movable members 52' carrying lower scrubbing roller 82 are rigidly interconnected by an auxiliary rigid member 84'. A pair of auxiliary movable members 86 are disposed for vertical movement in the manner of movable members 52' in a pair of auxiliary slots 88 disposed on a common longitudinal axis with slots 56'. Auxiliary movable members 86 are interconnected by a first rigid member 60' substantially identical to first rigid member 60. First rigid member 60' is connected as part of anti-sway apparatus 50' substantially identical to anti-sway apparatus 50. An adjusting member 74' substantially identical to adjusting member 74 is operably connected between rigid top 36 and first rigid member 60' to affect the controlled vertical movement thereof. Movable members 52' and auxiliary movable members 86 are rigidly interconnected for simultaneous combined movement by rigid connecting bars 90 with lower scrubbing roller 82 in parallel relationship to the upper Billy roller 62'. Thus, as first rigid member 60' is adjusted vertically up and down by the rotational movement of knurled knob 78', auxiliary movable members 86 and lower scrubbing roller 82 in combination therewith are adjusted simultaneously while maintaining the continued parallel relationship of lower scrubbing roller 82 to Billy roller 62' as desired.

The precision roller adjusting apparatus of the present invention having been thus described, attention is now drawn to partial-drying apparatus generally shown as 92 employed in the scrubber/dryer 32 of the present invention according to the preferred embodiment thereof. As shown in FIG. 2, in the preferred embodiment, the majority of the washing water is removed from the upper and lower surfaces of the printed circuit boards 10 by the partial-drying apparatus 92. The surfaces are then thoroughly dried before exit of the boards 10 through exit slot 42 by the application of low pressure air 94 through nozzles 96 connected by ducts 98 to a source of air (not shown) in the base of scrubber/dryer 32. Low pressure air 94 can be supplied in a heated or unheated state as dictated by the humidity conditions of the environment wherein scrubber/dryer 32 is operated by a number of techniques well known to those skilled in the art which form no part of the present invention.

Figure 8:
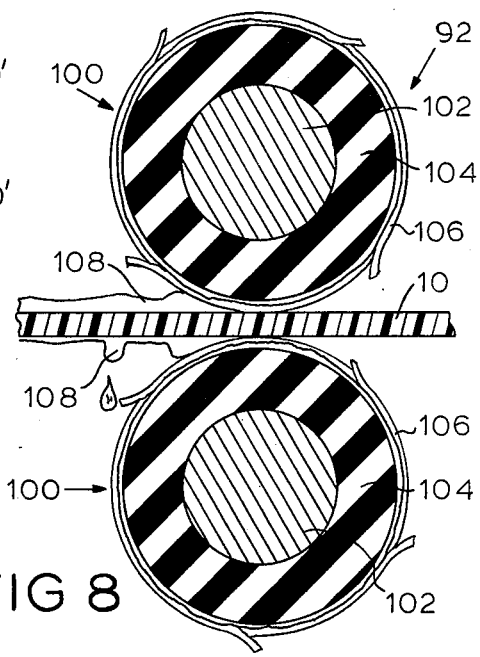
FIG. 8 is a detailed cut-away side elevation through the drying rollers of the present invention.
Figure 9:
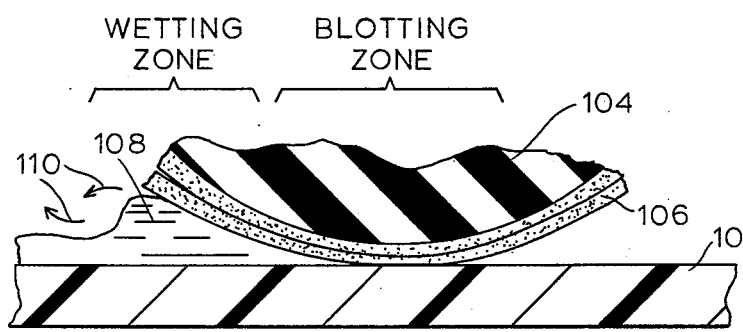
FIG. 9 is a detailed cut-away side elevation of one drying roller of FIG. 8 showing the method of operation thereof.

The construction and method of operation of the partial-drying apparatus 92 can best be understood with reference to FIGS. 8 and 9. While the apparatus 92 as shown employs a pair of driven "blotting" rollers (to be hereinafter described) to partially-dry both surfaces of the circuit boards 10 inasmuch as both surfaces are being washed, it is to be understood that either roller could be replaced by a Billy roller for supplying the requisite support to the printed circuit board 10 if only one surface were being washed, scrubbed, and dried. Apparatus 92 comprises a pair of opposed parallel spaced blotting rollers generally indicated as 100. Each roller 100 comprises a rigid bar stock core 102 rotatably journaled between the sidewalls 34 and driven by any of a number of well-known techniques. Cores 102 are of rigid steel stock of sufficient diameter to resist any bending or flexing whereby the desired compression adjacent the surface to be hereinafter described can be maintained along the length thereof. Cores 102 have cylindrical supporting layers 104 concentrically disposed thereabout along the length thereof. In the preferred embodiment, supporting layers 104 are comprised of a fairly resilient rubber. That is, a "sponge" type rubber would not operate in the desired manner to accomplish the results to be hereinafter described. The composition required of layer 104 will become apparent from its description in use. Over the cylindrical supporting layers 104, a plurality of sheets of chamois 106 are wrapped. In the preferred embodiment, three or four thin rectangular sheets of chamois are attached along one edge at intervals about the circumference to the rubber of supporting layers 104 longitudinally along the length of roller 100. The individual layers are then allowed to freely wrap about the layer 104 as the roller 100 rotates. As is well known, chamois has both desirable and undesirable characteristics in relation to the removal of water from a surface. When allowed to dry completely, chamois becomes stiff and brittle. When wrung dry (yet moist enough to remain pliable) chamois is pliable and has a great affinity for water.

Referring now to FIG. 9, rollers 100 are positioned to bear against the surface of the printed circuit board 10 in the manner shown therein with each roller 100 supporting the other. Chamois 106 is compressed between the supporting layer 104 and the surface of the printed circuit board 10 as the printed circuit board moves past roller 100 and roller 100 rotates. As seen in FIGS. 8 and 9, the rotating and compressing of the chamois layer 106 causes a ridge of water 108 to be continuously rolled and pushed back into scrubber/dryer 32 in the direction of arrows 110 to be ultimately rolled off the back edge of the printed circuit board 10 to fall into the sump or intake to the pump providing the wash water to hoses 46. The area of chamois 106 adjacent the water ridge 108 is constantly bathed in water in this wetting zone to maintain the chamois 106 in its required softened state. As the wet chamois 106 is compressed between the supporting layer 104 and the printed circuit board 10 at the area of contact, the majority of water in the chamois 106 is squeezed out and into the back moving water ridge 108. As the chamois 106 exiting the blotting zone begins to expand in its movement away from the surface of the printed circuit board 10, its great affinity for water causes it to absorb virtually any surface film of water remaining on printed circuit board 10. As can thus be seen, the compression characteristic of the supporting layer 104 (i.e. rubber) must be such that it is less compressible than the chamois 106 but sufficiently compressible that it can absorb the shock of ridges and the like on the surface of the printed circuit board 10.

Thus, it can be seen from the foregoing description that the apparatus of the present invention provides improved scrubbing and drying apparatus meeting the stated objectives of providing a precision adjusting mechanism for the scrubbing rollers of a scrubber/dryer wherein the roller is constantly maintained in a parallel relationship to the opposing Billy roller whereby constant pressure is maintained by the scrubbing roller across the lateral surface of the printed circuit board or the like being scrubbed thereby. In like manner, the chamois covered blotting roller incorporated therein provides an improved partial-drying of the printed circuit board whereby only low pressure air need be applied to cause the printed circuit boards to be completely dried before emerging from the scrubber/dryer.

Wherefore, having thus described my invention, I claim:

1. In apparatus for scrubbing a generally planar surface of a material moving through a scrubbing zone disposed between a pair of parallel rigid side members and having a scrubbing roller rotatably mounted between the side members for scrubbing the surface by rotating about an axis parallel to the surface, the improvement for allowing the position of the roller to be adjusted toward and away from the surface while maintaining the rotational axis parallel thereto, said improvement comprising:
   (a) a pair of movable members carried by respective ones of the side members for movement only longitudinally along a line substantially normal to the plane of the planar surface;
   (b) a scrubbing roller rotatably journaled between said pair of movable members for rotation about an axis of rotation extending longitudinally therethrough;
   (c) a first rigid member connected between said pair of movable members to hold said members in positional relationship whereby said axis of rotation of said roller is substantially parallel to the planar surface and said pair of members can only be moved in combination;
   (d) a second rigid member connected between the side members in parallel spaced relationship to said first rigid member;
   (e) a third rigid member disposed between said first and second rigid members hingedly carried by said first rigid member on one side and hingedly carried by said second rigid member on the other side for movement only rotatably about respective axes parallel to the surface to be scrubbed; and,
   (f) roller adjusting means for moving said movable members and said roller thereby between desired positions for positioning said roller and for holding said movable members and said roller thereby in said positions.

2. The scrubbing apparatus claimed in claim 1 wherein said roller adjusting means comprises:
   (a) a fourth rigid member disposed in parallel spaced relationship to said first rigid member along the line of movement of said movable members; and
   (b) an adjusting member rotatably carried by said fourth rigid member on one end and in threaded engagement with said first rigid member on the other end whereby when said adjusting member is rotated said first rigid member and said movable members and roller in combination therewith are positionally adjusted in relation to the planar surface.

3. The scrubbing apparatus claimed in claim 1 wherein said third rigid member is hingedly carried by said first and second rigid members by:
   (a) said first and second rigid members each having a groove disposed along a line parallel to the planar surface to be scrubbed;
   (b) said third rigid member having substantially semicircular edges adjacent each of said grooves, said edges being disposed in respective ones of said grooves whereby said third rigid member can move only through a limited arc of rotational movement.

4. In scrubbing and drying apparatus having an enclosure containing a plurality of equally spaced driven rollers mounted thereto defining a pathway for moving a flat article therethrough and having a source of water directed on a surface of the article, a scrubbing roller mounted between a pair of movable members for scrubbing the surface of the article, a partial-drying assembly for removing a portion of the water on the article following the scrubbing thereof, and a source of drying air for drying the remaining water from the partially dried article, the improvement comprising:
(a) anti-sway means connected to the movable members for holding the movable members in positional synchronization as said members are moved whereby the scrubbing roller is always maintained parallel to the surface of the article being scrubbed thereby; and,
(b) adjusting means interconnected between the enclosure and said anti-sway means for positionally adjusting said anti-sway means whereby the parallel distance from said roller to the pathway through which the articles are moved is adjusted.

5. The improvement to scrubbing and drying apparatus of claim 4 wherein said adjusting means comprises:
a shaft rotatably carried by the enclosure and having a gripping member on one end and having threads engaged with a corresponding threaded hole in said anti-sway means on the other end whereby rotating said shaft in opposite directions with said gripping member causes said anti-sway means to be forced away from and drawn towards the enclosure respectively to effect positional adjustment of the roller.

6. The improvement to scrubbing and drying apparatus of claim 4 wherein said partial-drying assembly comprises:
(a) a first roller having a rigid center shaft rotatably journaled for rotation, a cylindrical layer of supporting material concentrically disposed about said center shaft, and a porous compressible material disposed concentrically about said layer of supporting material; and,
(b) a second roller disposed in parallel spaced relationship to said first roller on the opposite side of the pathway in the enclosure to force the article against said first roller as the article is moved therebetween an amount sufficient to compress said porous compressible material between the article and said layer of supporting material whereby the water is blotted from the article by the compressing and decompressing of said porous compressible material.

7. The improvement to scrubbing and drying apparatus of claim 6 wherein:
said second roller is substantially of identical construction to said first roller whereby both sides of the article are blotted simultaneously.

8. The improvement to scrubbing and drying apparatus of claim 6 wherein:
said porous compressible material is a chamois sheet attached to said layer of supporting material on one edge longitudinally thereacross and thereafter freely wrapped about said latter-named layer.

9. The improvement to scrubbing and drying apparatus of claim 8 wherein said porous compressible material comprises a plurality of said chamois sheets longitudinally attached to said layer of supporting material at radially spaced intervals about the circumference thereof.

10. The improvement to scrubbing and drying apparatus of claim 6 wherein:
said layer of supporting material is rubber being less compressible than said porous compressible material.

11. An improved scrubber/dryer for printed circuit boards comprising:
(a) a box-shaped enclosure having an entry slit for inserting printed circuit boards on one end and an exit slit for removing printed circuit boards on the opposite end;
(b) a plurality of parallel, opposed, spaced, driven roller pairs disposed within said enclosure between said entry slit and said exit slit for moving printed circuit boards in a plane between said entry slit and said exit slit;
(c) a driven scrubbing roller assembly disposed in said enclosure for scrubbing a surface of printed circuit boards moving along said plane, said assembly including anti-sway means for maintaining said scrubbing roller parallel to said plane and for allowing said scrubbing roller to be moved toward and away from said plane;
(d) adjusting means for moving said scrubbing roller to desired positional distances from said plane and for holding said roller at said positional distances whereby said roller can be adjusted to accommodate various thicknesses of printed circuit boards and to apply preselected scrubbing forces equally across the surface of printed circuit boards passing through said scrubber/dryer;
(e) means disposed within said enclosure for directing a flow of washing water on printed circuit boards passing therethrough;
(f) a supporting roller disposed within said enclosure to support the opposite surface of printed circuit boards moving therethrough from that surface scrubbed by said scrubbing roller at a point in the path of movement thereof after said scrubbing roller; and,
(g) a driven blotting roller disposed within said enclosure in parallel-spaced opposition to said support roller, said blotting roller having a rigid center shaft, a cylindrical layer of supporting material concentrically disposed about said center shaft, and a porous compressible material disposed concentrically about said layer of supporting material, said blotting roller being disposed relative to said supporting roller such that printed circuit boards passing therebetween compress said porous compressible material between the scrubbed surface thereof and said layer of supporting material whereby the water is blotted from the scrubbed surface of the printed circuit boards by the compressing and decompressing of said porous compressible material.

12. The scrubber/dryer of claim 11 and additionally comprising:
means for directing low pressure drying air on the blotted surface of the printed circuit boards disposed within said enclosure after said blotting roller in the path of movement of the printed circuit boards through the scrubber/dryer.

13. The scrubber/dryer of claim 11 wherein:
said supporting roller is also a blotting roller substantially identical to said first described blotting roller whereby both sides of printed circuit boards passing through said scrubber/dryer are blotted by mutually supporting blotting rollers.

* * * * *